(12) United States Patent
Kondo

(10) Patent No.: US 12,328,925 B2
(45) Date of Patent: Jun. 10, 2025

(54) SEMICONDUCTOR DEVICE

(71) Applicants: SANKEN ELECTRIC CO., LTD., Niiza (JP); Allegro MicroSystems, LLC, Manchester, NH (US)

(72) Inventor: Taro Kondo, Niiza (JP)

(73) Assignees: SANKEN ELECTRIC CO., LTD., Niiza (JP); Allegro MicroSystems, LLC, Manchester, NH (US)

( * ) Notice: Subject to any disclaimer, the term of this patent is extended or adjusted under 35 U.S.C. 154(b) by 513 days.

(21) Appl. No.: 17/702,015

(22) Filed: Mar. 23, 2022

(65) Prior Publication Data

US 2022/0216310 A1 Jul. 7, 2022

Related U.S. Application Data

(63) Continuation-in-part of application No. 17/163,626, filed on Feb. 1, 2021, now abandoned.

(30) Foreign Application Priority Data

Sep. 18, 2020 (JP) .................................. 2020-157789

(51) Int. Cl.
| | |
|---|---|
| *H10D 64/00* | (2025.01) |
| *H10D 30/66* | (2025.01) |
| *H10D 62/17* | (2025.01) |
| *H10D 64/01* | (2025.01) |
| *H10D 64/23* | (2025.01) |

(52) U.S. Cl.
CPC ......... *H10D 64/115* (2025.01); *H10D 30/668* (2025.01); *H10D 62/393* (2025.01); *H10D 64/01* (2025.01); *H10D 64/117* (2025.01); *H10D 64/252* (2025.01)

(58) Field of Classification Search
CPC . H01L 29/405; H01L 29/407; H01L 29/1079; H01L 29/1095; H01L 29/7813
See application file for complete search history.

(56) References Cited

U.S. PATENT DOCUMENTS

| | | | | |
|---|---|---|---|---|
| 8,076,719 | B2* | 12/2011 | Zeng | ................. H01L 29/66727 |
| | | | | 257/334 |
| 2002/0185679 | A1* | 12/2002 | Baliga | ................. H01L 29/7813 |
| | | | | 257/329 |

(Continued)

FOREIGN PATENT DOCUMENTS

JP 2010171417 A * 8/2010 ........... H01L 29/401

*Primary Examiner* — Joseph C. Nicely
(74) *Attorney, Agent, or Firm* — METROLEX IP LAW GROUP, PLLC; Robert L. Scott, Esq.

(57) ABSTRACT

A semiconductor device is disclosed including a sub-layer with first conductivity type, a drift layer with first conductivity type, a base region with second conductivity type positioned on the drift layer, a source region in contact with the base region, a source electrode, a plurality of trenches, at least one of the trenches in contact with the drift layer, the base region, and the source region, a plurality of insulating regions, at least one of the insulating regions positioned inside of each trench, a plurality of gate electrodes, at least one of the gate electrodes positioned inside of each trench; and a plurality of field plates, at least one of the field plates electrically connected to the source electrode and positioned in the insulating region in the trench. The field plate comprises high-resistance polysilicon.

18 Claims, 7 Drawing Sheets

(56) References Cited

U.S. PATENT DOCUMENTS

| | | | |
|---|---|---|---|
| 2009/0256210 A1* | 10/2009 | Matsushita | H10D 89/601 257/E21.409 |
| 2012/0043602 A1* | 2/2012 | Zeng | H10D 62/107 257/329 |
| 2013/0043532 A1* | 2/2013 | Disney | H10D 30/603 257/E29.256 |
| 2016/0172235 A1* | 6/2016 | Srinivasan | H01L 21/763 438/430 |
| 2021/0083061 A1* | 3/2021 | Darwish | H01L 29/7813 |
| 2021/0351289 A1* | 11/2021 | Hsieh | H10D 64/117 |
| 2022/0045184 A1* | 2/2022 | Hsieh | H01L 21/02532 |
| 2022/0293786 A1* | 9/2022 | Hsieh | H01L 21/76205 |

* cited by examiner

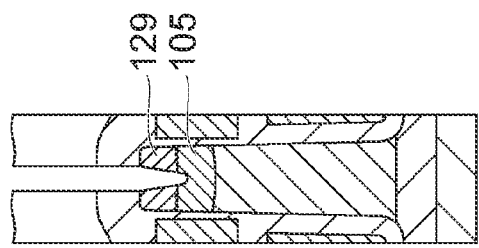
FIG. 7A
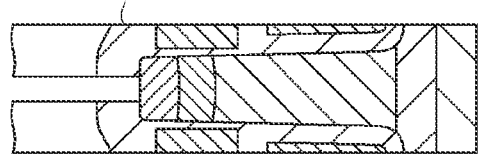
FIG. 7B
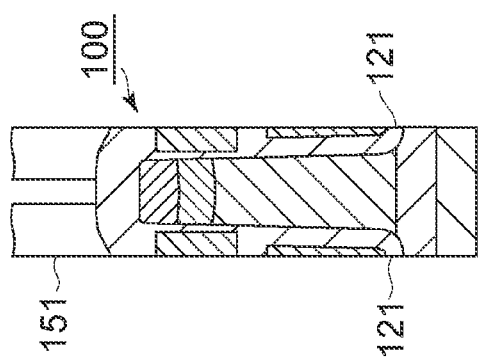
FIG. 7C   FIG. 7D
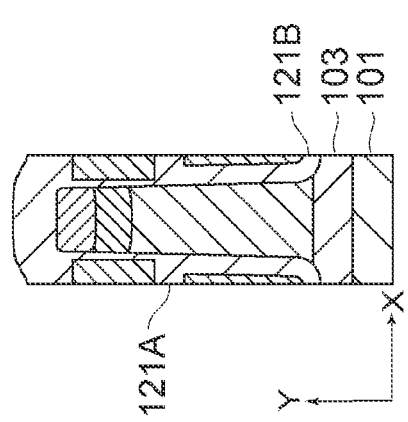
FIG. 7E
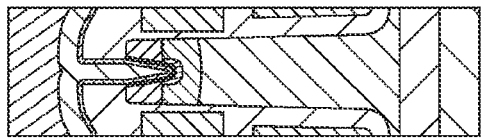
FIG. 7F
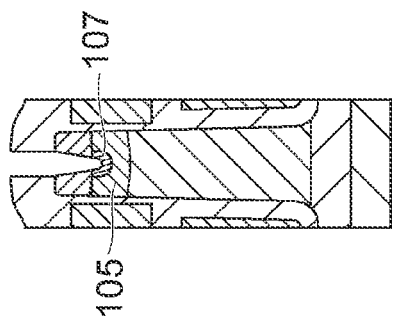
FIG. 7G
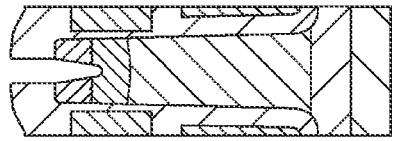
FIG. 7H
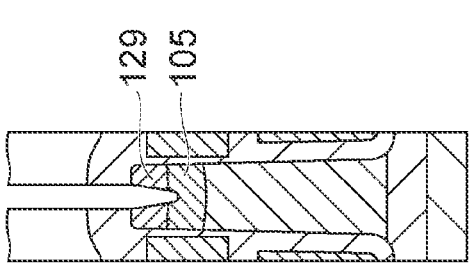

SEMICONDUCTOR DEVICE

CROSS REFERENCE TO RELATED APPLICATIONS

This application is a continuation-in-part application of application Ser. No. 17/163,626 filed on Feb. 1, 2021, which claims priority to prior Japanese Patent Application No. 2020-157789 filed with the Japan Patent Office on Sep. 18, 2020, the entire contents of which are incorporated herein by reference.

BACKGROUND

The disclosure relates to a semiconductor device, or more specifically, to a power semiconductor device including a metal-oxide semiconductor field-effect transistor (MOSFET) capable of controlling soft recovery.

Japanese Patent Application Publication No. 2015-018913 (Patent Document 1) discloses a super junction MOSFET which is capable of reducing a reverse recovery current and a reverse recovery period by relaxing a hard recovery waveform during a reverse recovery operation, thereby achieving high-speed switching and a low reverse recovery loss. In this super junction MOSFET, a second buffer layer having a higher concentration than an n-type drift layer 4a of a parallel pn layer is formed under a first buffer layer. Carrier lifetime of each of the first buffer layer and the parallel pn layer is adjusted to be shorter than carrier lifetime of the second buffer layer. Thus, a rise of the hard recovery waveform is made gentle to form a soft recovery waveform (paragraph 0031 of Patent Document 1).

Japanese Patent Application Publication No. 2017-011001 (Patent Document 2) discloses a semiconductor device which is configured to reduce a forward voltage drop and suppress waveform oscillation during reverse recovery, and has soft recovery characteristics. In this semiconductor device, a width in a lateral direction of an $n^+$ cathode region is set shorter than a width in a lateral direction of a FWD anode part. Thus, the above described configuration promotes hole injection from a portion of a $p^+$ collector region, which faces the FWD anode part across an $n^-$ drift layer, to the $n^-$ drift layer. In this way, a carrier concentration on the $n^+$ cathode region side of the $n^-$ drift layer is increased. Accordingly, the forward voltage drop of the FWD can be reduced and the FWD is more likely to be turned on. As a consequence, it is possible to achieve the soft recovery (lowering a peak of a reverse recovery current If) and suppression of a waveform oscillation (lowering a peak of a voltage surge Vak) during the reverse recovery of the FWD (paragraph 0065 of Patent Document 2).

In general, when a switching element in a power semiconductor device transitions from an on-state to an off-state, for instance, a signal may fluctuate for a certain period on and before the switching element transitions completely to the off-state. This period from the start to the end of the fluctuation of the signal, or in other words, the period from a time point when the signal is once set to the off-state (with no current) to a time point when the signal completely becomes the off-state after the fluctuation of this signal in transition of the switching element from the on-state to the off-state is defined as reverse recovery time ($T_{RR}$). Short reverse recovery time is generally preferred in light of stabilization of operations of the semiconductor device and reduction in power consumption. In addition, a sharp change in current may bring about an adverse impact such as a breakdown on the semiconductor device. In this regard, a soft recovery technique is known as a technique for shortening the reverse recovery time while reducing the sharp change in current during the transition of the switching element from the on-state to the off-state.

SUMMARY

A semiconductor device according to one or more embodiments may include: a sub-layer with first conductivity type; a drift layer with first conductivity type, a base region with second conductivity type positioned on the drift layer, a source region in contact with the base region, a source electrode, a plurality of trenches, each trench in contact with the drift layer, the base region, and the source region, a plurality of insulating regions, each insulating region positioned inside of each trench, a plurality of gate electrodes, each gate electrode positioned inside of each trench, and a plurality of field plates, each field plate electrically connected to the source electrode and positioned in the insulating region in the trench. The field plate may comprise high-resistance polysilicon. In one or more embodiments, the resistance between one of the field plates inside of a trench and the source electrode may be 50 kΩ or more to 800 kΩ or less. In one or more embodiments, the resistance between one of the field plates and the source electrode may be 58 kΩ or more to 254 kΩ or less. In one or more embodiments, the resistance between one of the field plates inside of a trench and the source electrode may be 25 kΩ or more to 300 kΩ or less. In one or more embodiments, the resistance between one of the field plates and the source electrode may be 55 kΩ or more to 260 kΩ or less. In the disclosed embodiments, the drift layer may comprise impurities, a pinch-off state does not substantially occur at the impurity concentration. In disclosed embodiments, the gate electrode may be positioned closer to the sub-layer side than the base region. In disclosed embodiments, portion of the gate electrode having a shortest distance from the sub layer may be positioned such that the shortest distance is shorter than a distance of the sub-layer from the portion of the base region in contact with the trench of the gate electrode. In disclosed embodiments, portion of the gate electrode having the shortest distance from the sub layer may be positioned in a range of 0.1 μm or more and 0.5 μm or less than the distance of the sub-layer from the portion of the base region in contact with the trench of the gate electrode.

One or more additional or alternative embodiments may include a shallow region positioned inside the base region between the trenches, and positioned below the contact digging structure, and below the silicon contact. In disclosed embodiments, the shallow region may include a second conductivity type. In disclosed embodiments, the shallow region may include a higher impurity concentration than the base region.

BRIEF DESCRIPTION OF DRAWINGS

FIGS. 7A, 7B, 7C, 7D, 7E, 7F, 7G, and 7H are diagrams illustrating cross-sectional views of a manufacturing process of a semiconductor device according to one or more embodiments.

DETAILED DESCRIPTION

Figure 1:
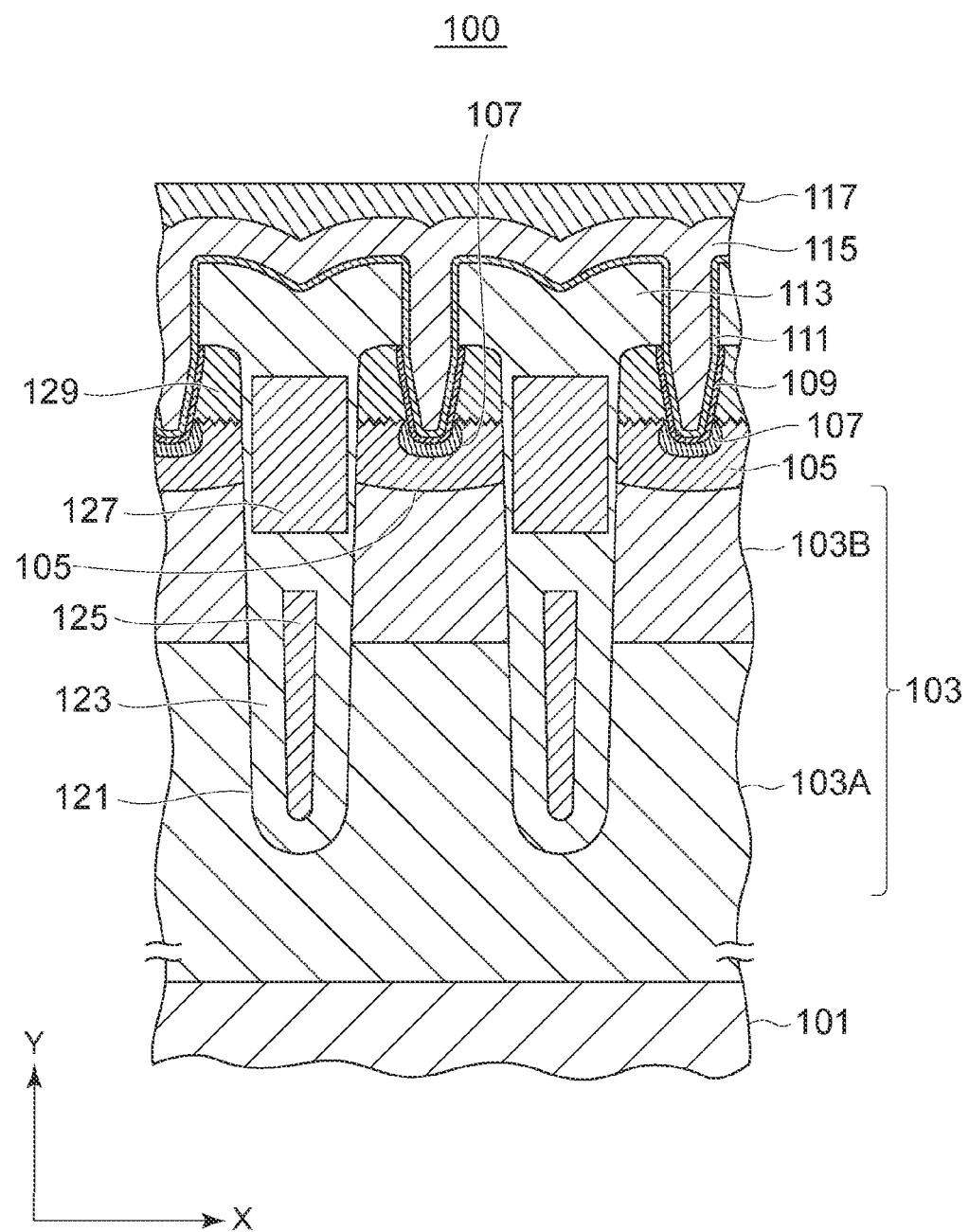
FIG. 1 is a diagram illustrating a cross-sectional view of a semiconductor device according to one or more embodiments.

One or more embodiments are described in detail with reference to the drawings. In the following description of the drawings, identical or similar portions may be denoted by identical or similar reference numerals. The description of the drawings is schematic. Relations of thicknesses and dimensions, ratios of thicknesses of layers, and the like are mere examples and do not intend to limit the technical ideas of the invention. Dimensional relations or ratios may vary among the drawings. The following embodiments will describe an example in which a first conductivity type is an n-type and a second conductivity type is a p-type. However, there is also a case where it is possible to select a reverse relation of the conductivity types where the first conductivity type is the p-type and the second conductivity type is the n-type. When positional relations among components are discussed in the following description, explanations including an "upper side", a "lower side", a "right side", a "left side", and so forth are used as appropriate based on directions in the drawings to be referred to. Nonetheless, these directions do not limit the technical ideas of the invention. Meanwhile, the explanations including the "upper side", the "lower side", the "right side", the "left side", and so forth may be used even when relevant components are not in contact. On the other hand, an X axis and a Y axis may be illustrated when explaining the directions. Here, mainly in a case of a cross-sectional view, a "lateral direction" or a "longitudinal direction" may represent an X direction or an opposite direction to the X direction in the illustrated drawings. Meanwhile, a "height direction" may represent a Y direction in the illustrated drawing. In the meantime, a "depth direction" may represent an opposite direction to the Y direction in the illustrated drawing.

FIG. 1 is a diagram illustrating a cross-sectional view of a semiconductor device 100 according to one or more embodiments. The semiconductor device 100 includes a sub-layer 101, a drift layer 103 positioned above the sub-layer 101, a base region 105 positioned above the drift layer 103, shallow regions 107, an alloy layer 109, a metal layer 111, a first insulating region 113, a metal region 115, a source electrode 117, trenches 121, second insulating regions 123, field plates 125, gate electrodes 127, and a source region 129. In the semiconductor device 100, the trenches 121 are positioned in a depth direction in the drift layer 103, and each trench 121 is filled a member corresponding to the second insulating region 123. The field plate 125 and the gate electrode 127 are positioned inside each second insulating region 123. While the embodiment or embodiments of FIG. 1 illustrates two trenches, the invention is not limited only to the above described configuration. The semiconductor device 100 of the embodiment or embodiments may include one, three, four, or more trenches instead.

The drift layer 103 is positioned above the sub-layer 101. Each of the sub-layer 101 and the drift layer 103 may be of the first conductivity type, and the sub-layer 101 may have a higher impurity concentration than that of the drift layer 103. The drift layer 103 may be formed by epitaxial growth and its impurity concentration is preferably set to such a concentration that does not cause a pinch-off. Here, a dosage amount of the impurity in the drift layer 103 is set preferably in a range from about $2.0\,e^{16}\,cm^{-3}$ to $9.0\,e^{16}\,cm^{-3}$ in the case of the 40-V withstand voltage class. Meanwhile, the dosage amount of the impurity in the drift layer 103 is set preferably in a range from about $1.3\,e^{16}\,cm^{-3}$ to $2.3\,e^{16}\,cm^{-3}$ in the case of the 100-V withstand voltage class. The drift layer 103 of the semiconductor device 100 may be set to a single impurity concentration. However, the invention is not limited to the foregoing. For example, as illustrated in FIG. 1, the drift layer 103 may include a drift layer 103A that has a certain impurity concentration and a drift layer 103B that has an impurity concentration different from that of the drift layer 103A. In this case, an electric field intensity of the gate electrode 127 can be relaxed by controlling the concentration and the thickness of the drift layer 103B near the gate electrode 127. For example, the impurity concentration in drift layer 103A is higher than that in drift layer 103B.

The base region 105 is positioned above the drift layer 103. The base region 105 may be of the second conductivity type.

Each shallow region 107 is positioned in the base region 105. In the meantime, the shallow region 107 may be positioned below an excavated contact structure and below a silicon contact as illustrated in FIG. 1. The shallow region 107 may be of the second conductivity type and may have a higher impurity concentration than that of the base region 105. Here, a breakdown is brought about at a p-n junction part below the silicon contact by providing the shallow region 107 making it possible to increase the electric field intensity only at a rise of a recovery current without extending a depletion layer toward the base region 105.

The alloy layer 109 is positioned between the metal layer 111 and the base region 105 that includes the shallow regions 107. The metal layer 111 may contain titanium. In general, when silicon is directly bonded to a metal (such as aluminum), interdiffusion of the metal (such as aluminum) and silicon may develop an aluminum spike. The alloy layer 109 is positioned in order to relax the aluminum spike. A silicide layer may be formed by subjecting the metal layer 111 to a thermal treatment. When the metal layer 111 contains titanium, a titanium silicide layer is formed by the thermal treatment.

The first insulating region 113 is positioned in the metal layer 111. The first insulating region 113 may contain silicon dioxide ($SiO_2$). Alternatively, the first insulating region 113 may contain the same material as the second insulating region 123.

The metal region 115 is positioned above the metal layer 111. The metal region 115 may contain tungsten. The source electrode 117 is positioned above the metal region 115. The source electrode 117 may be made of an aluminum alloy or an aluminum-copper alloy.

Each trench 121 is positioned inside the drift layer 103 in such a way as to extend in a depth direction of the semiconductor device 100, or in other word, from the source electrode 117 side to the sub-layer 101 side. Here, a shape of an outer wall of the trench 121 may be set parallel to the depth direction of the semiconductor device 100 or gradually tapered in the depth direction. In the case of the tapered shape, the shape is preferably set to an elevation angle equal to or above 80 degrees but below 90 degrees when viewed from a bottom surface of the semiconductor device 100, or more preferably set to the elevation angle in a range from 83 degrees to 87 degrees.

Each second insulating region 123 is positioned in the trench 121. The field plate 125 and the gate electrode 127 are positioned in the second insulating region 123. The field plate 125 is electrically coupled to the source electrode 117. By providing the field plate 125 in the trench 121, it is possible to achieve a high withstanding voltage while relaxing electric field concentration.

Figure 8:
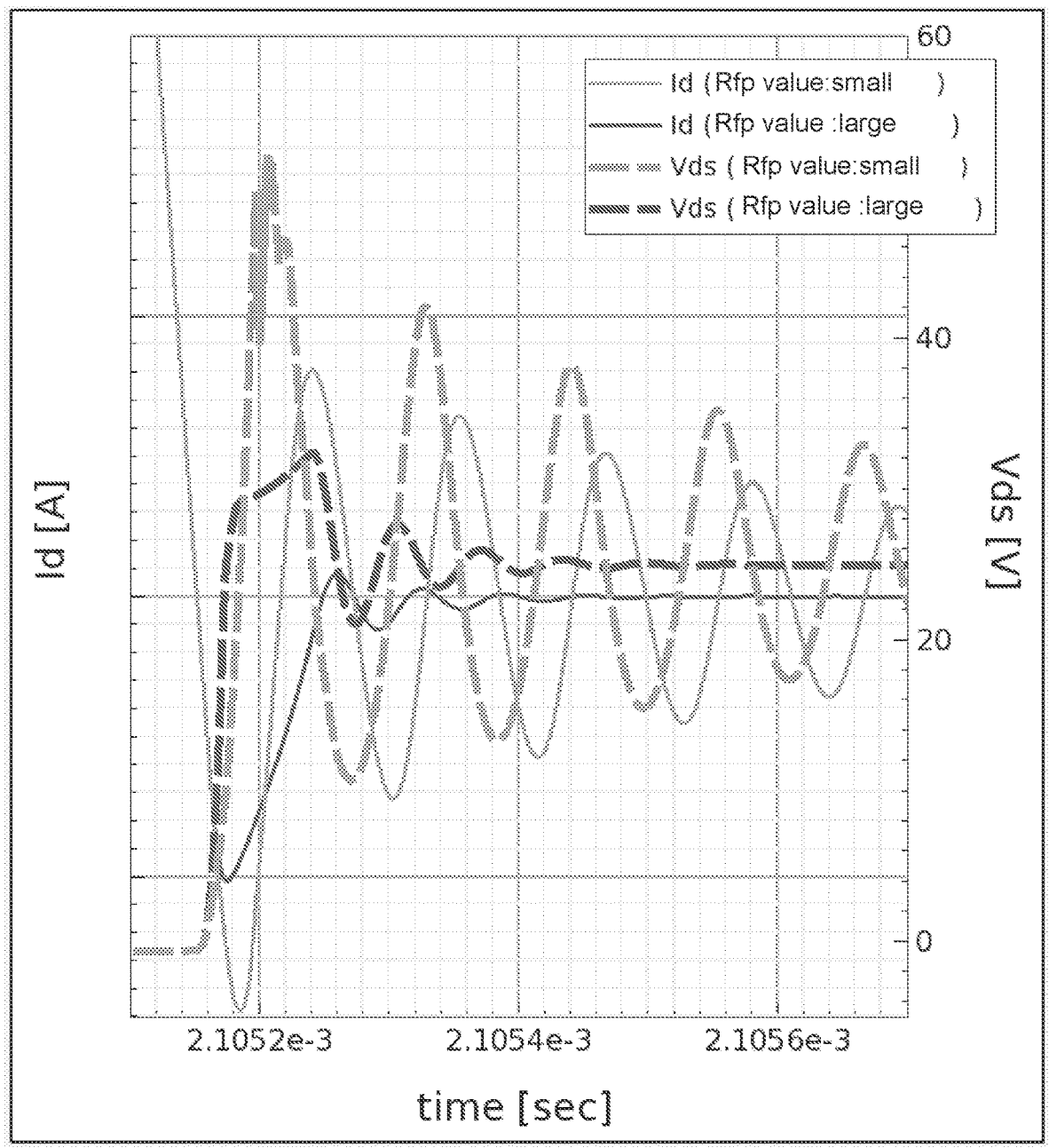
FIG. 8 is a graph diagram illustrating a relationship between drain-source voltage Vds and recovery current Id during a recovery period.

Each field plate 125 may contain a polycrystalline semiconductor material such as polycrystalline silicon. In the embodiment or embodiments, the field plate 125 contains high-resistance polycrystalline silicon. The field plate 125 of the embodiment or embodiments is electrically coupled to the source electrode 117 via this high-resistance polycrystalline silicon. In other words, the field plate 125 of the embodiment or embodiments includes high-resistance polycrystalline silicon and is electrically coupled to the source electrode 117. Since the field plate 125 contains high-resistance polycrystalline silicon, an electric resistance Rfp between the field plate 125 and the source electrode 117 becomes high. Here, it is known to be effective to set a lower resistance between the field plate 125 and the source electrode 117 in order to reduce an effect of a displacement current. The embodiment or embodiments controls the displacement current by adjusting the resistance between the field plate 125 and the source electrode 117. By controlling the displacement current, the soft recovery of the semiconductor device 100 is controlled. This resistance value between the field plate 125 and the source electrode 117 may be set in a range from about 50 kΩ to 800 kΩ inclusive per trench, or preferably in a range from about 58 kΩ to 254 kΩ inclusive. Meanwhile, a sheet resistance may be set to about 25 kΩ/sq or preferably equal to or above 29.7 kΩ. On the other hand, the value of Rfp may be set to about 5 Ω/sq. In this way, it is possible to improve a soft recovery characteristic of the semiconductor device 100. In one or more embodiments, the resistance value between the field plate 125 and the source electrode 117 may be set in a range from about 25 kΩ to 300 kΩ inclusive per trench, or preferably in a range from about 55 kΩ to 260 kΩ inclusive. FIG. 8 is a graph diagram illustrating the relationship between drain-source voltage Vds and recovery current Id during the recovery period. In FIG. 8, the results of the drain source voltage Vds and the recovery current Id during the recovery period are shown when the resistance (Rfp) value is small and the resistance (Rfp) value is large. When the resistance (Rfp) value is large, the voltage Vds is reduced only during the recovery period, and the magnitude and slope of the recovery current Id are reduced.

In the meantime, the gate electrode 127 is preferably positioned on the depth direction side relative to the base region 105, or in other words, on the sub-layer 101 side. A portion of the gate electrode 127 having the shortest distance from the sub-layer 101 may be positioned closer to the sub-layer 101 than a portion of the base region 105 in contact with the trench 121 corresponding to the gate electrode 127 by an amount in a range from about 0.1 μm to 0.5 μm. In this way, the distance between the gate electrode 127 and the sub-layer 101 can be reduced. Here, the electric field intensity can be increased when the distance between the portion of the gate electrode 127 located closest to the sub-layer 101 and the portion of the base region 105 in contact with the trench 121 corresponding to the gate electrode 127 is short. A bottom portion of the gate electrode 127, that is, an end of its surface close to the sub-layer 101 may be tapered. Alternatively, the end of the surface close to the sub-layer 101 may be rounded. In this way, it is possible to achieve the high withstanding voltage while relaxing the electric field concentration.

The source region 129 is positioned above the base region 105 and on upper side surfaces of the trenches 121. The source region 129 may be of the first conductivity type. An outer wall of the source region 129, or in other words, a wall where the alloy layer 109 and the metal layer 111 come into with the metal region 115 may be set substantially perpendicular in view of the bottom surface of the semiconductor device 100 or may be tapered as illustrated in FIG. 1. In this case, the outer wall is preferably set to an elevation angle equal to or above 80 degrees but below 90 degrees when viewed from the bottom surface of the semiconductor device 100, or more preferably set to the elevation angle in a range from 83 degrees to 87 degrees. By forming the outer surface into the tapered shape as described above, it is possible to reduce the electric field intensity while relaxing the electric field concentration.

Figure 2:
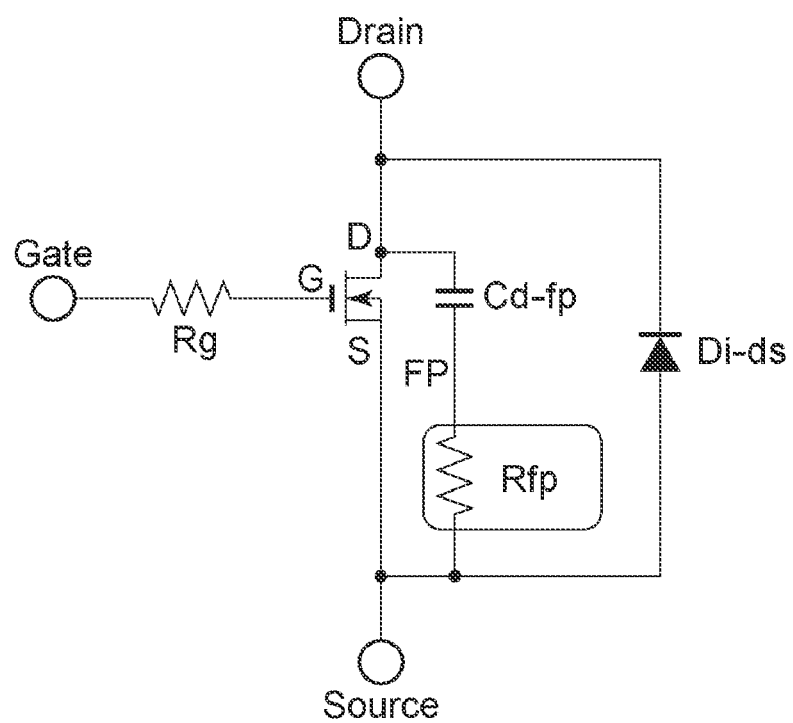
FIG. 2 is a circuit diagram illustrating an equivalent circuit of a semiconductor device, such as is illustrated in FIG. 1.

FIG. 2 illustrates an equivalent circuit diagram of the semiconductor device 100 depicted in FIG. 1, which represents a case where just one trench 121 is positioned for the purpose of simplification.

Figure 3:
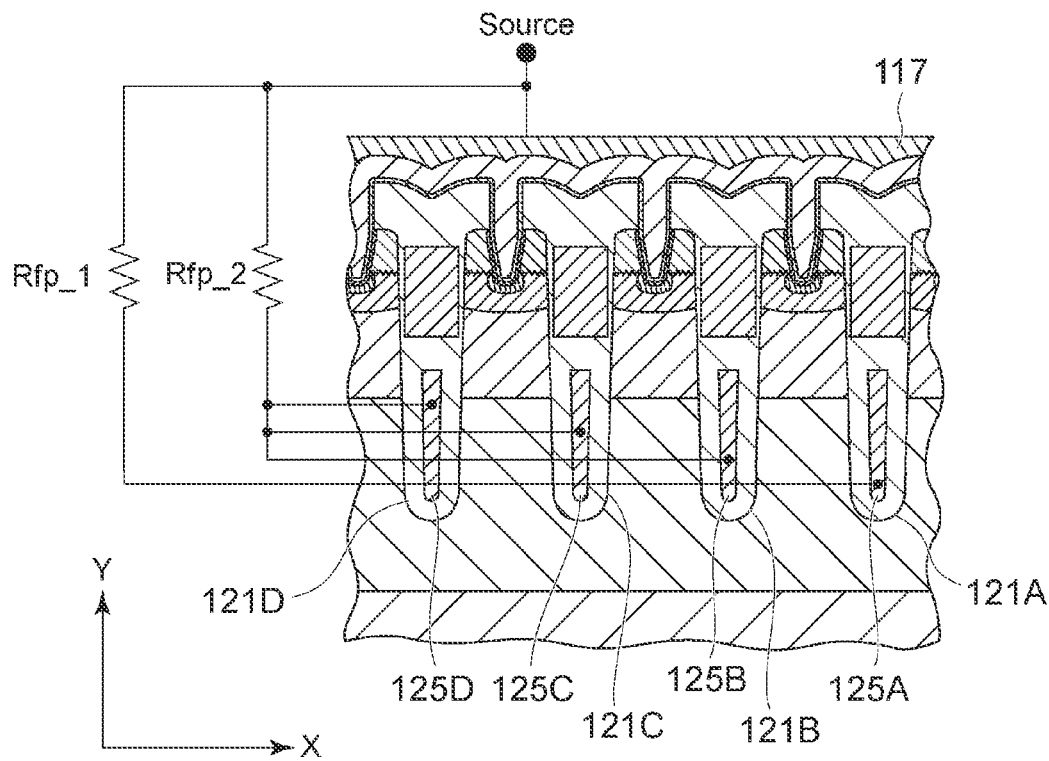
FIG. 3 is a diagram illustrating a cross-sectional view of a semiconductor device according to one or more embodiments.

FIG. 3 is a cross-sectional view illustrating another one or more embodiments of the semiconductor device 100. In the embodiment or embodiments, the semiconductor device 100 includes the trenches 121A, 121B, 121C, and 121D, and the field plates 125A, 125B, 125C, and 125D are positioned inside the trenches 121, respectively. Here, the resistance values Rfp between the field plates 125 and the source electrode 117 may be different from one another. In the semiconductor device 100 illustrated in FIG. 3, the resistance between a field plate 125A and the source electrode 117 is set to Rfp_1 and the resistance between a field plate 125B, 125C, or 125D and the source electrode 117 is set to Rfp_2. Provision of such different resistance values Rfp makes it possible to deal with a change in displacement current more appropriately and to obtain a stable reverse recovery time ($T_{RR}$) characteristic even in the case of facing a sharp change in withstand voltage.

Figure 4:
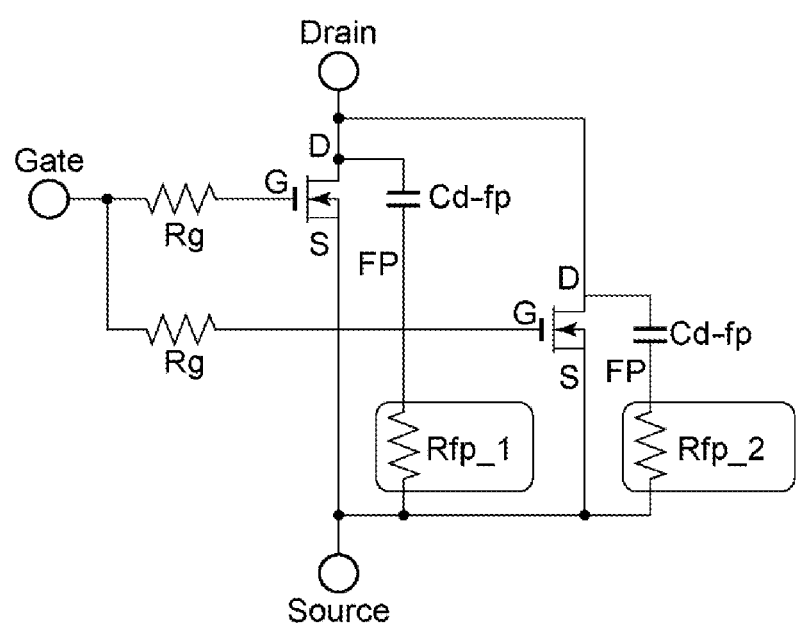
FIG. 4 is a circuit diagram illustrating an equivalent of a semiconductor device, such as is illustrated in FIG. 3.

FIG. 4 illustrates an equivalent circuit diagram of the semiconductor device depicted in FIG. 3, which represents a case where just the trench 121A and the trench 121B are positioned for the purpose of simplification.

Figure 5:
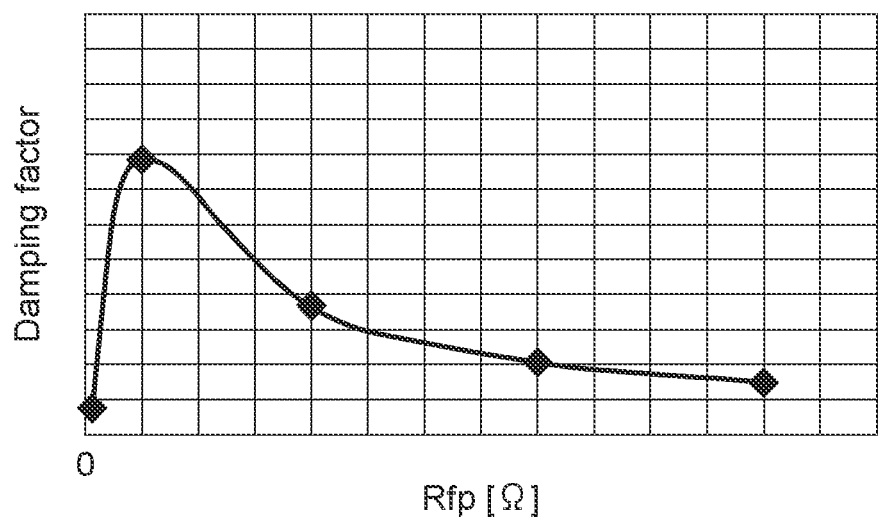
FIG. 5 is a diagram illustrating a graph for explaining a damping factor.

FIG. 5 is a diagram illustrating a relation between the resistance Rfp and a damping factor. The damping factor generally represents a braking coefficient for damping oscillation. The higher the damping factor is, the higher the ability of the soft recovery is achieved. As a consequence of analyzing the damping factor of the embodiment or embodiments, it turns out that the damping factor reaches a maximum at a certain value of the resistance Rfp and then reduces thereafter in some cases. From this finding, the inventor has obtained the knowledge that the performance of the soft recovery can be improved by obtaining the high damping factor as a consequence of controlling the resistance (Rfp) between the field plate 125 and the source electrode 117.

In one or more embodiments, the shallow region 107 of the semiconductor device 100 is formed at a position deeper than the source region 129. Further, the impurity concentration in the drift layer 103A is higher than the impurity concentration in the drift layer 103B, which is positioned between the drift layer 103A and the base region. The drift layer 103B comprises such impurity concentration that a pinch-off state does not substantially occur, which makes it difficult for the depletion layer to extend to the shallow region 107 and the drift layer 103B during the period when the recovery current rises.

The electric field in the region below the shallow region 107 is further increased at a voltage lower than the product withstand voltage only during the recovery period, and the electric field breaks down in or near that region. As a result, the breakdown voltage drops temporarily. The shallow region 107 may be provided by engraving the upper surface of the semiconductor so as to be arranged under the contact digging structure and under the silicon contact allowing for more breakdown below or near that area.

Further, when the electric field in the region below the shallow region 107 increases, the potential of the field plate 125 rises. Here, the resistance Rfp between the field plate 125 of the semiconductor device 100 and the source electrode 117 according to one or more embodiments is high resistance. As a result, the maximum voltage at the start of recovery of the semiconductor device 100 is reduced. As described above, the soft recovery characteristics of the recovery period of the semiconductor device 100 may be improved.

The depletion layer extends during the steady state of recovery. The breakdown point of the semiconductor device 100 is arranged, for example, at the bottom of the trench 121, and the breakdown is occurred at a voltage equal to or higher than the product withstand voltage. At the startup of recovery, since the concentration of impurities in the drift layer 103A is low, the depletion layer tends to extend, and most of the recovery current flows through the capacitor generated between the drift layer 103B and the field plate 125. During the steady state of recovery, part of the recovery current flows through the capacitor generated between the drift layer 103A and the field plate 125.

Figure 6:
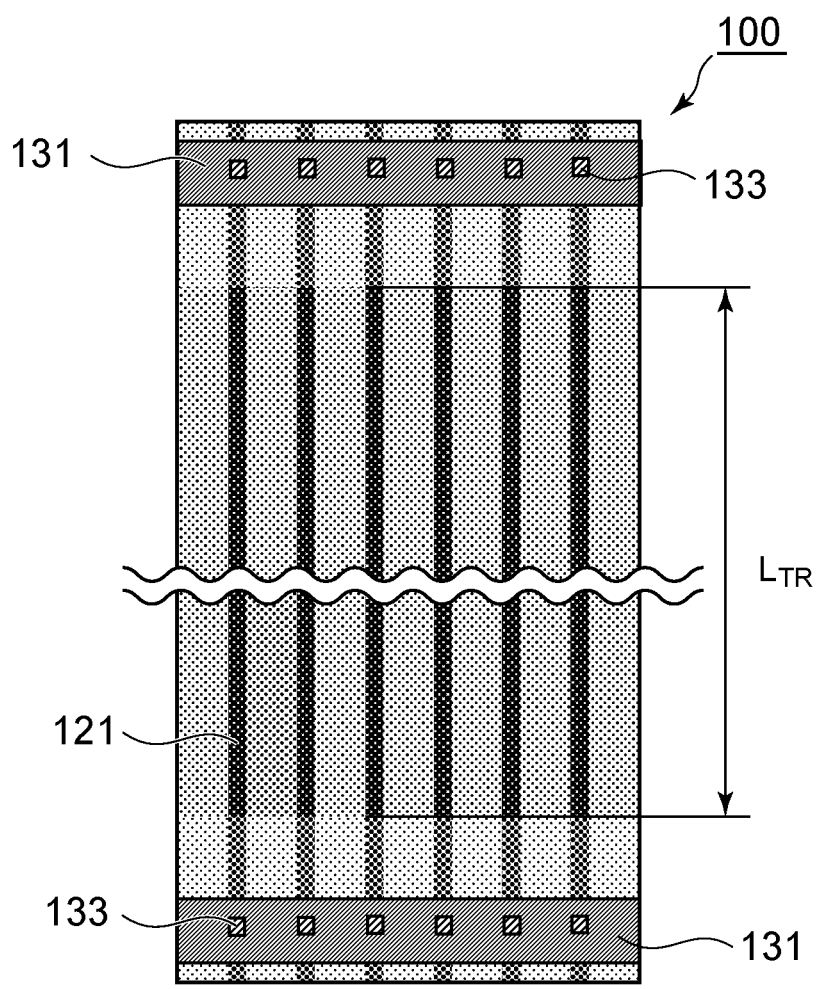
FIG. 6 is a diagram illustrating a top plan view of a semiconductor device according to one or more embodiments.

FIG. 6 is a top plan view of the semiconductor device 100 of another embodiment or embodiments. With reference to FIG. 6, a description will be given of the control of the resistance (Rfp) between the field plate 125 and the source electrode 117. As illustrated in FIG. 6, the semiconductor device 100 includes the trenches 121. Two ends of each trench 121 are a positive electrode and a negative electrode. Here, a trench length LTR of a portion sandwiched by the positive electrode and the negative electrode may be adjusted in order to adjust the resistance Rfp. Meanwhile, in a manufacturing process, the resistance Rfp may be adjusted by controlling the dosage amount of the impurity in polycrystalline silicon. In addition, the resistance Rfp may be controlled by regulating a sheet resistance of polycrystalline silicon included in the field plate 125. As mentioned above, it is possible to set the optimum resistance Rfp by using the trench length LTR, the dosage amount of the impurity in polycrystalline silicon, or a combination thereof.

In order to set the resistance Rfp between the field plate 125 and the source electrode 117 to the high resistance, it is also possible to set a contact resistance to a high resistance in addition to the field plate 125 and the trench 121, for example. In FIG. 6, for instance, an electrode 131 to be electrically coupled to the source electrode is electrically coupled to the field plate 125 via a contact opening 133. The resistance Rfp between the field plate 125 and the source electrode 117 can be set to the high resistance by changing the size of this contact opening 133.

FIGS. 7A, 7B, 7C, 7D, 7E, 7F, 7G, and 7H are diagrams for explaining a process of forming the shallow region 107.

As an example, FIGS. 7A, 7B, 7C, 7D, 7E, 7F, 7G, and 7H illustrate cross-sectional views of a portion between the trenches 121 depicted in FIG. 1, which are cross-sectional views that depict part of the portion between the trench 121A and the trench 121B for the convenience of explanations. FIG. 7A shows a process after the respective regions mentioned above are formed above the sub-layer 101 and the drift layer 103. FIG. 7B shows a process after coating a photoresist 151 on a surface of this work-in-progress semiconductor device, the photoresist 151 is subjected to selective exposure by irradiating a photomask and then the photoresist 151 is selectively removed. In the embodiment or embodiments, a portion of the photoresist 151 located between the trench 121A and the trench 121B is removed so as to expose the first insulating region 113 at that portion. FIG. 7C shows a process after the first insulating region 113 is etched. This etching may be continued until reaching the source region 129. FIG. 7D shows a process after the source region 129 is etched so as to reach the inside of the base region 105. In the course of this etching, the source region 129 and the base region 105 may be tapered as illustrated in FIG. 7D. FIG. 7E shows a process after the base region 105 is subjected to ion implantation. In this ion implantation, the impurity of the second conductivity type may be ion implanted. FIG. 7F shows a process after the photoresist coated on the surface of the semiconductor device 100 is removed. FIG. 7G shows a process after the shallow region 107 is formed in the base region 105 by diffusing the ion implanted impurity by a thermal treatment process such as rapid thermal annealing (RTA). FIG. 7H shows a process after the alloy layer 109, the metal layer 111, the metal region 115, and the source electrode 117 are formed as needed. The semiconductor device 100 including the shallow regions 107 may be manufactured.

A conventional semiconductor device requires an additional circuit such as a snubber circuit in order to improve its soft recovery characteristic. In the meantime, the conventional semiconductor device faces a difficulty in controlling its structure and can hardly obtain a stable recovery characteristic as a consequence. The semiconductor device according to the one or more embodiments described above has an improved soft recovery capability.

The above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

What is claimed is:

1. A semiconductor device comprising:
   a sub-layer with first conductivity type;
   a drift layer with first conductivity type;
   a base region with second conductivity type positioned on the drift layer;
   a source region in contact with the base region;
   a source electrode;
   a plurality of trenches, at least one of the trenches in contact with the drift layer, the base region, and the source region;

a plurality of insulating regions, at least one of the insulating regions positioned inside of each trench;

a plurality of gate electrodes, at least one of the gate electrodes positioned inside of each trench; and a plurality of field plates, at least one of the field plates electrically connected to the source electrode and positioned in the insulating region in the trench, wherein the drift layer comprises a first region and a second region, which is positioned between the first region and the base region, and the second region has lower impurity concentration than the first region, a resistance between one of the field plates inside of a trench and the source electrode is 50 kΩ or more to 800 kΩ or less, and the first region and the second region both face the field plate via the insulating region, wherein the second region comprises such impurity concentration that a pinch-off state does not substantially occur at the second region.

2. The semiconductor device according to claim 1, wherein at least one of the field plates comprises polysilicon having a sheet resistance of 29.7 Ω/sq or higher.

3. The semiconductor device according to claim 1, wherein a resistance between one of the field plates and the source electrode is 58 kΩ or more to 254 kΩ or less.

4. The semiconductor device according to claim 1, wherein the gate electrode is positioned closer to the sub-layer side than the base region.

5. The semiconductor device according to claim 1, wherein a portion of the gate electrode having a shortest distance from the sub-layer is positioned such that the shortest distance is shorter than a distance of the sub-layer from the base region in contact with the trench.

6. The semiconductor device according to claim 1, wherein the base region further comprises a shallow region that is positioned deeper than the source region.

7. The semiconductor device according to claim 6, wherein the shallow region is positioned below a contact digging structure.

8. The semiconductor device according to claim 6, wherein the shallow region is positioned below a silicon contact.

9. The semiconductor device according to claim 6, wherein the shallow region comprises the second conductivity type.

10. The semiconductor device according to claim 6, wherein the shallow region has higher impurity concentration than the base region.

11. The semiconductor device according to claim 10, wherein a resistance between one of the field plates and the source electrode is 58 kΩ or more to 254 kΩ or less.

12. The semiconductor device according to claim 1, the resistance between at least one selected from the plurality of field plates and the source electrode and the resistance between at least one other field plate selected from the plurality of field plates and the source electrode are different values.

13. The semiconductor device according to claim 1, wherein the second region comprises such impurity concentration that the pinch-off state does not substantially occur at the second region during a time period in which a recovery current between the drift layer and the at least one of the plurality of field plates rises.

14. A semiconductor device comprising:
a sub-layer with first conductivity type;
a drift layer with first conductivity type;
a base region with second conductivity type positioned on the drift layer;
a source region in contact with the base region;
a source electrode;
a plurality of trenches, at least one of the trenches in contact with the drift layer, the base region, and the source region;
a plurality of insulating regions, at least one of the insulating regions positioned inside of each trench;
a plurality of gate electrodes, at least one of the gate electrodes positioned inside of each trench; and
a plurality of field plates, at least one of the field plates electrically connected to the source electrode and positioned in the insulating region in the trench, wherein
the drift layer comprises a first region and a second region, which is positioned between the first region and the base region, and the second region has lower impurity concentration than the first region,
a resistance between one of the field plates inside of a trench and the source electrode is 50 kΩ or more to 800 kΩ or less, and
the first region and the second region both face the field plate via the insulating region, wherein
a portion of the gate electrode having a shortest distance from the sub layer is positioned closer to the sub-layer by an amount in a range of 0.1 μm or more and 0.5 μm or less than a distance of the sub-layer from the base region in contact with the trench.

15. A semiconductor device comprising:
a sub-layer with first conductivity type;
a drift layer with first conductivity type;
a base region with second conductivity type positioned on the drift layer;
a source region in contact with the base region;
a source electrode;
a plurality of trenches, at least one of the trenches in contact with the drift layer, the base region, and the source region;
a plurality of insulating regions, at least one of the insulating regions positioned inside of each trench;
a plurality of gate electrodes, at least one of the gate electrodes positioned inside of each trench; and
a plurality of field plates, at least one of the field plates electrically connected to the source electrode and positioned in the insulating region in the trench, wherein
the drift layer comprises a first region and a second region, which is positioned between the first region and the base region, and the second region has lower impurity concentration than the first region,
a resistance between one of the field plates inside of a trench and the source electrode is 50 kΩ or more to 800 kΩ or less, and
the first region and the second region both face the field plate via the insulating region, wherein
the height of the interface between the first region and the second region is higher than the height of the bottom ⅓ of the field plate.

16. A semiconductor device comprising:
a sub-layer with first conductivity type;
a drift layer with first conductivity type;
a base region with second conductivity type positioned on the drift layer;
a source region in contact with the base region;
a source electrode;
a plurality of trenches, at least one of the trenches in contact with the drift layer, the base region, and the source region;

a plurality of insulating regions, at least one of the insulating regions positioned inside of each trench;

a plurality of gate electrodes, at least one of the gate electrodes positioned inside of each trench; and a plurality of field plates, at least one of the field plates electrically connected to the source electrode and positioned in the insulating region in the trench, wherein the drift layer comprises a first region and a second region, which is positioned between the first region and the base region, and the second region has lower impurity concentration than the first region, the first region and the second region both face the field plate via the insulating region, and the field plate includes polysilicon with a sheet resistance of 29.7 Ω/sq or higher, wherein the resistance between at least one selected from the plurality of field plates and the source electrode is different from the resistance between at least one of the other field plates selected from the plurality of field plates and the source electrode.

17. The semiconductor device according to claim 16, wherein a resistance between one of the field plates inside of a trench and the source electrode is 50 kΩ or more to 800 kΩ or less.

18. The semiconductor device according to claim 16, wherein the base region further comprises a shallow region that is positioned deeper than the source region, the shallow region is positioned below a contact digging structure, the shallow region is positioned below a silicon contact, the shallow region comprises the second conductivity type, and the shallow region has higher impurity concentration than the base region.

* * * * *